United States Patent [19]

Smoot

[11] Patent Number: 4,565,974
[45] Date of Patent: Jan. 21, 1986

[54] OPTICAL RECEIVER CIRCUIT WITH ACTIVE EQUALIZER

[75] Inventor: Lanny S. Smoot, Essex, N.J.

[73] Assignee: AT&T Bell Laboratories, Murray Hill, N.J.

[21] Appl. No.: 640,259

[22] Filed: Aug. 13, 1984

[51] Int. Cl.[4] .................. H03F 3/191; H03G 3/10
[52] U.S. Cl. .................. 330/304; 330/279; 330/284; 330/308
[58] Field of Search .... 250/214 A, 214 AG, 214 AL; 330/59, 108, 144, 145, 279, 284, 304, 308; 333/18

[56] References Cited

U.S. PATENT DOCUMENTS

| | | | |
|---|---|---|---|
| 4,165,495 | 8/1979 | Takahashi | 333/18 X |
| 4,415,803 | 11/1983 | Muoi | 250/214 |
| 4,498,001 | 2/1985 | Smoot | 250/214 A |

Primary Examiner—Eugene R. LaRoche
Assistant Examiner—Steven J. Mottola
Attorney, Agent, or Firm—Volker R. Ulbrich

[57] ABSTRACT

The circuit (34) is of the type having an input section (12) and a shaping section (22). The input section includes a photodiode (14) and a transimpedance amplifier (16) with an AGC shunt device (19) connected between its input nodes (+,−). The shaping section includes, in order, an AGC amplifier (24), an equalizer amplifier (26), a buffer amplifier (42), and a filter (44). A controller (36) responsive to the photocurrent controls the impedance value of a dynamic impedance in the equalizer so that the frequency zero of the equalizer tracks the pole frequency of the input section as it changes in the course of changes in the value of its AGC shunt. This maintains the frequency response of the shaping section so that it continues to compensate for the frequency response characteristic of the input section. A trigger (52) responsive to the impedance value of the shunt activates the equalizer only when the shunt is active.

Also disclosed is a particularly advantageous differential configuration for the equalizer which includes a diode bridge (76,78,80,82) and four setting resistors ($R_1, R_2, R_3, R_4$) by which the break points for the frequency response can be set.

8 Claims, 4 Drawing Figures

OPTICAL RECEIVER CIRCUIT WITH ACTIVE EQUALIZER

TECHNICAL FIELD

The invention relates generally to electrical circuits for receiving optical signals and relates more particularly to circuits of this type with a means for controlling the input signal amplitude.

Optical receivers are used for, among other things, receiving the signal at one end of an optical fiber signal transmission system. The receiver consists of a signal input section, sometimes called a "front end" and a signal amplifying and shaping section, sometimes called a "linear channel." The front end includes a photodetector. The photocurrent from the photodetector is amplified by a transimpedance amplifier to convert it to a signal having a voltage level high enough to make it relatively insensitive to ambient noise influences. The linear channel then amplifies and shapes the signal for maximum "eye" opening and equalizes it so that at the output it has a constant nominal peak-to-peak voltage level. The shaping is accomplished by a first amplifier with an Automatic Gain Control (AGC) incorporated in it and a second amplifier with an equalizer circuit incorporated in it.

The photodetector, which is usually a P-region, intrinsic, N-region (PIN) diode device, generates a photocurrent in response to a light signal. Its photocurrent can easily saturate the amplifier when there is too much light input. This results in a loss of signal. Such saturation can be effectively prevented by the provision of an automatic shunt resistor between the input nodes of the transimpedance amplifier. The automatic shunt draws off excess photocurrent and prevents receiver saturation at high optical input levels. An arrangement of this type is described in the U.S. Pat. No. 4,498,001, issued Feb. 5, 1985 to the present inventor, entitled "An Improved Transimpedance Amplifier" and also assigned to the present assignee.

While the front end shunt does prevent saturation of the front end transimpedance amplifier, it brings with it another problem. As the value of the shunt resistor is changed, the frequency response of the front end section also is changed. This disrupts the signal shaping function of the linear channel, which is designed to precisely compensate for the frequency response characteristics of the front end.

SUMMARY OF THE INVENTION

The novel optical receiver circuit in accordance with the present invention includes a linear channel section with an active equalizer controlled by the photocurrent of the input network. This approach takes advantage of the fact that when an AGC optical receiver is in its AGC region, that being when its AGC shunt device is on at all, the output a.c. (alternating current) signal peak-to-peak voltage of the front end is held constant. Therefore, there is an inverse relationship between the impedance of the front end and the input signal current. By appropriate scaling of the current transfer gain, the equalizer frequency response can be made to track changes in the front end frequency response.

The equalizer is controlled so that its frequency zero always coincides with that of the front end section. Consequently, the frequency response compensation provided by the linear channel shaping section follows any frequency response changes in the front end section as a result of the operation of the AGC circuit.

The particular type of equalizer used is active in nature and therefore has certain additional advantages. It provides increased gain at high frequencies, rather than less loss at high frequencies, as is the case with a passive equalizer in the linear channel. It uses a differential configuration which results in exceptionally high common mode noise immunity.

DETAILED DESCRIPTION

Figure 1:
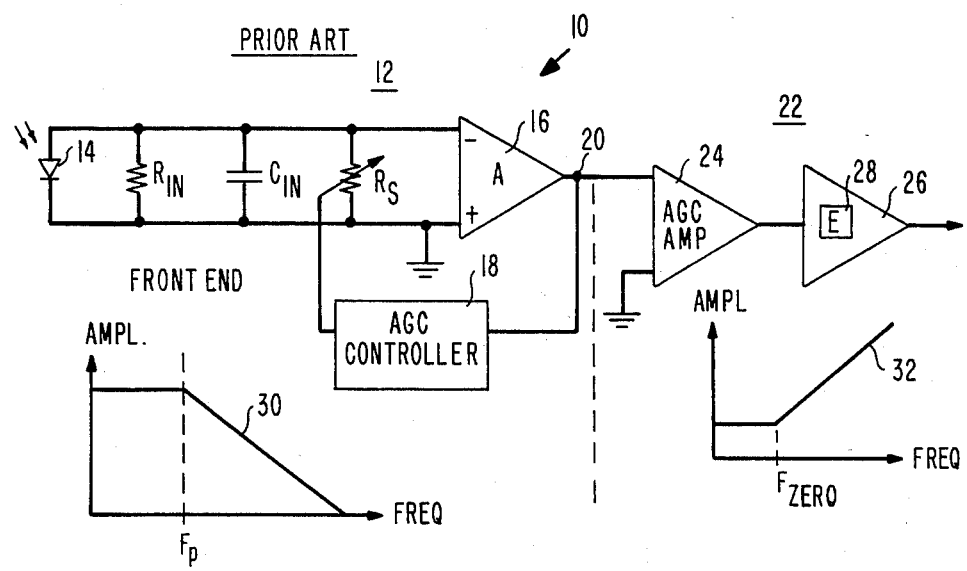
FIG. 1 is a schematic circuit diagram of a portion of a prior art optical receiver circuit, including an input section and a shaping section, and showing in association with each section a Bode graph representing an approximation of its frequency response.

The optical receiver circuit 10 of FIG. 1 is a prior art arrangement of the type discussed above. To the left of the vertical, dashed line is the front end section 12, which includes a PIN photodiode 14. Resistor $R_{IN}$ represents the input resistance of a front end amplifier 16. Capacitor $C_{IN}$ represents the front end amplifier input capacitances. Resistor $R_S$ is a variable resistance shunt element connected between the inverting (−) and noninverting (+) input nodes of amplifier 16. The shunt resistor $R_S$ is controlled by an AGC controller 18 in response to peak-to-peak voltage values at the ouput node 20 of the amplifier 16. From the output node 20 of the amplifier 16 the signal passes to a linear channel section 22, in which it goes first to an AGC amplifier 24 and then to an equalizing amplifier 26 which includes an equalizer 28. >From there the signal passes to other portions of the linear channel section 22 which are not shown.

Immediately below the front end 12 there is shown an exaggerated graphical approximation of the Bode curve of the front end frequency response. The ordinate represents signal amplification and the abscissa represents the frequency of the signal. The curve 30 shows that there is a relatively steep drop in the frequency response at the pole frequency $F_p$ caused by the front end RC network. Reference to the Bode curve 32 in the graph immediately below the linear channel 22 shows that the linear channel 22 is designed to have a frequency response which is complementary to that of the front end 12. As a result, for a given value of the shunt resistor $R_s$, the circuit 10 has a flat frequency response, with the frequency zero $F_0$ of the equalizer 26 of the linear channel 22 being at the pole frequency $F_p$ of the front end 12. It is apparent, however, that if the value of the shunt resistor $R_s$ is changed by the controller 18, the frequency response of the front end 12 changes, and the responses of the front end 12 and the linear channel 22 will no longer be entirely complementary. This leads to a loss of flat overall response.

Figure 2:
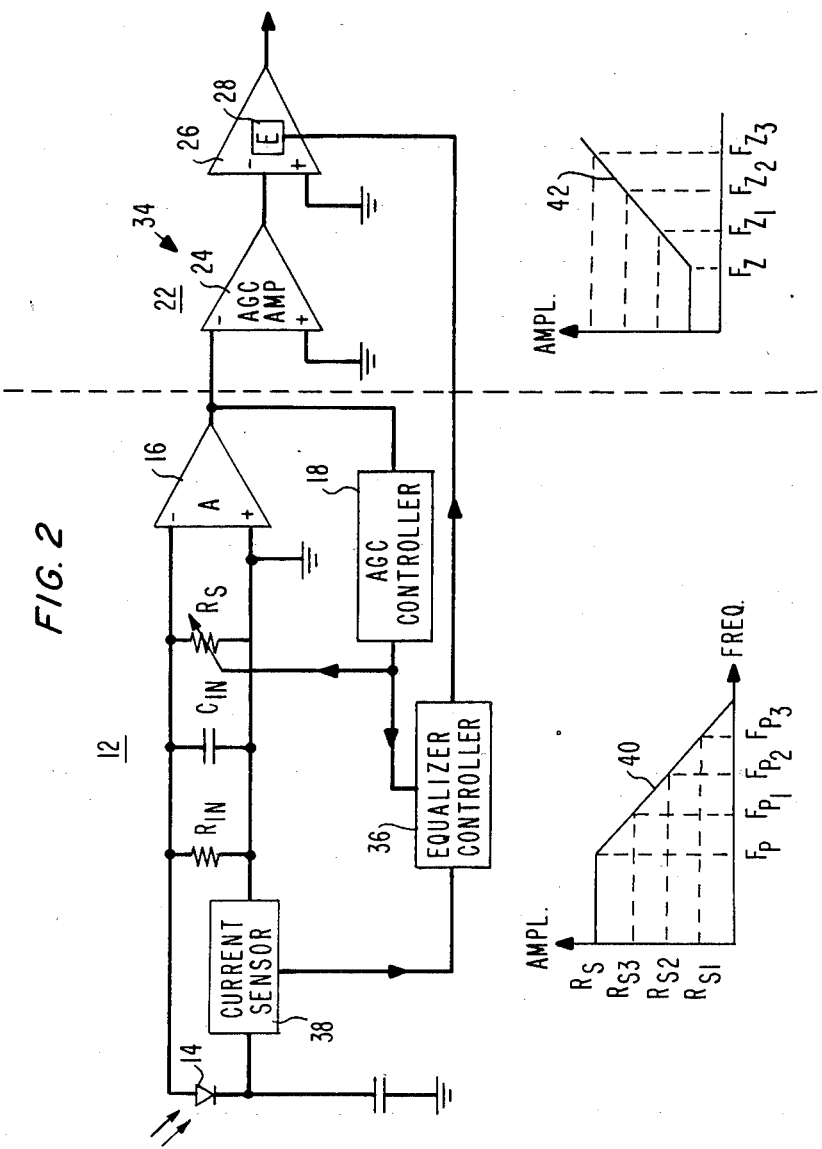
FIG. 2 is a schematic circuit diagram of a portion of an optical receiver circuit in accordance with the present invention, including a means for controlling an equalizer in the shaping section in response to photocurrent in the input section. Also shown in association with each section is a Bode graph representing an approximation of its frequency response.

The novel optical receiver circuit 34 of FIG. 2 in accordance with the present invention is in many respects similar to the circuit 10 of FIG. 1. Therefore, the same reference symbols are used for corresponding elements. The circuit 34, however, is provided with a controller 36 which automatically adjusts the equalizer 28 in response to the photocurrent in the front end 12 as sensed by a sensor 38. As a result, the frequency responses of the front end 12 and the linear channel 22 are maintained in a complementary relationship throughout the range of operation of the circuit 34. This is illustrated by the corresponding Bode curves 40 and 42 immediately below the front end 12 and linear channel 22, respectively, in the FIG. 2. With the curve 40 there are indicated the pole points corresponding to progressively decreasing values $R_s$, $R_{s3}$, $R_{s2}$, $R_{s1}$ of the shunt resistor $R_s$ against increasing values $F_p$, $F_{P1}$, $F_{P2}$, $F_{P3}$ of the pole frequency $F_p$ which result respectively from such changes. With the curve 42, there are indicated the zero position points, $F_z$, $F_{z1}$, $F_{z2}$, $F_{z3}$ corresponding to the progressive changes made in the equalizer control current in response to the photocurrent sensed by the sensor 38 in order to compensate for the response changes in the front end 12.

Figure 3:
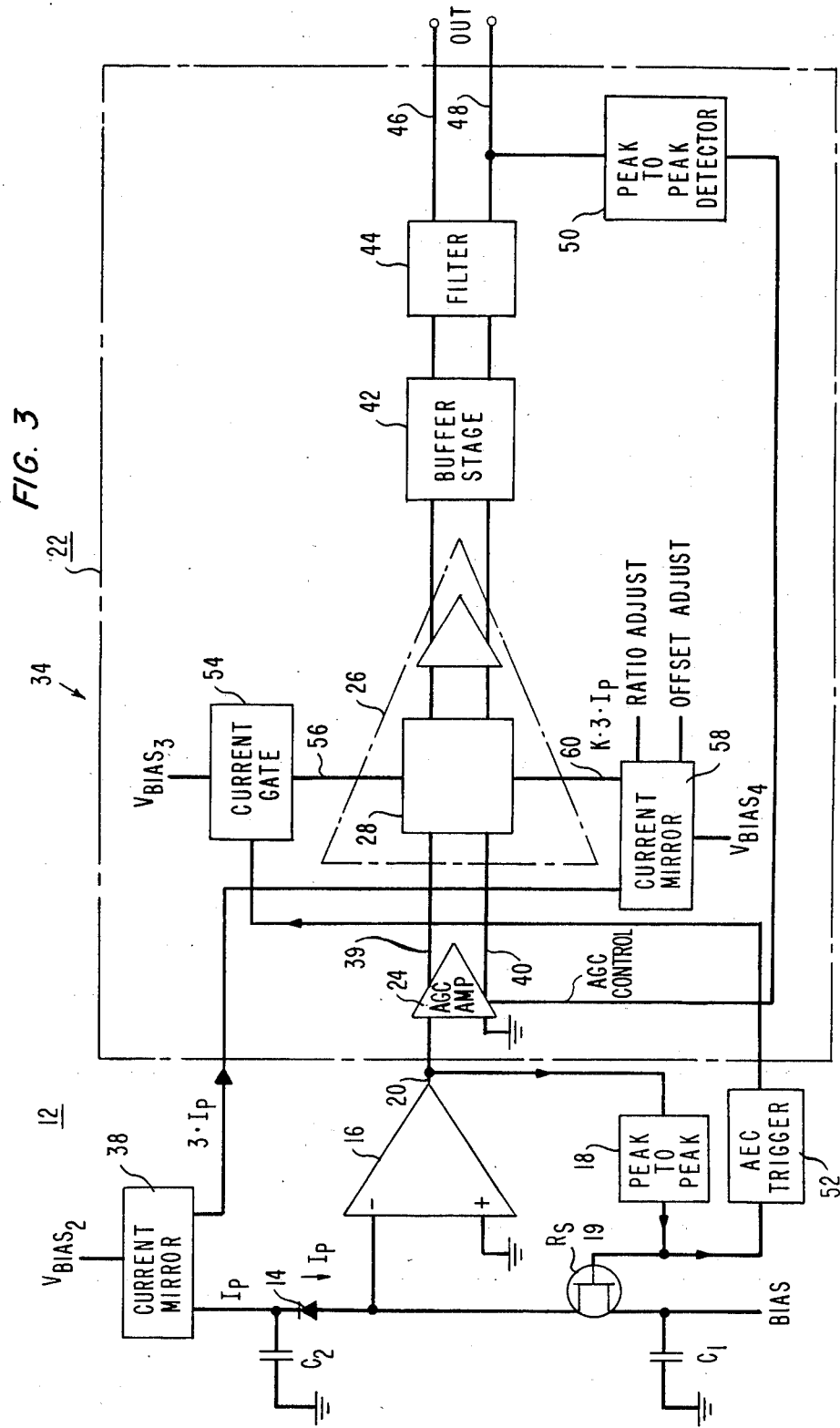
FIG. 3 is a schematic circuit diagram of one implementation of the circuit of FIG. 2 in more detail.

A more detailed diagram of the circuit 34 is shown in FIG. 3. Again, where elements correspond to those of previous figures, the previous reference symbols are retained. Reference to "ground" means to a relatively stable reference potential. In the circuit 34 the shunt resistor $R_s$ takes the form of an FET (field-effect transistor) device 19 which has its current path connected at one side to the inverting input (−) of a transimpedance amplifier 16 and at the other side to a bias voltage $V_{bias1}$ and through a capacitor $C_1$ to ground potential. The photodiode 14 is a PIN device connected at one side to the inverting input port (−) of the amplifier 16 and at the other side to a current mirror sensor 38 and through a capacitor $C_2$ to ground. The current mirror sensor 38 is connected to a bias voltage $V_{bias2}$ to establish appropriate operating conditions for its devices. A peak-to-peak detector 18, which has an input connected to the output 20 of the amplifier 16 and a control lead connected to the gate of the FET shunt device 19 acts as the controller for the automatic gain function of the shunt device 19. The output node 20 of the amplifier 16 is at the same time the output node of the front end 12 and the input node of the linear channel 22. In the linear channel, the signal passes to an automatic gain control amplifier 24 with dual ouputs 39, 40 connected to an equalizer amplifier 26. The outputs of the equalizer amplifier 26 are connected to a buffer stage 42 which, in turn, has its outputs connected to a filter 44. The outputs 46, 48 of the filter 44 provide the signal output of the circuit 34. A peak-to-peak detector 50, which has its input connected to the output 48 of the circuit 34 has its control lead connected to the amplifier 24 for regulating its internal AGC function. An automatic equalizer control trigger 52 has its input connected to the gate of the shunt device 19 and its output connected to a current gate 54 which is provided with a bias voltage $V_{bias3}$. The output node 56 of the current gate 54 goes to the equalizer amplifier 26. An output of the current mirror 38 is connected as the input to another current mirror 58 provided with a $V_{bias4}$, a current ratio adjustment, and a current offset adjustment. The output node 60 of this current mirror 58 also goes to the equalizer amplifier 26.

Figure 4:
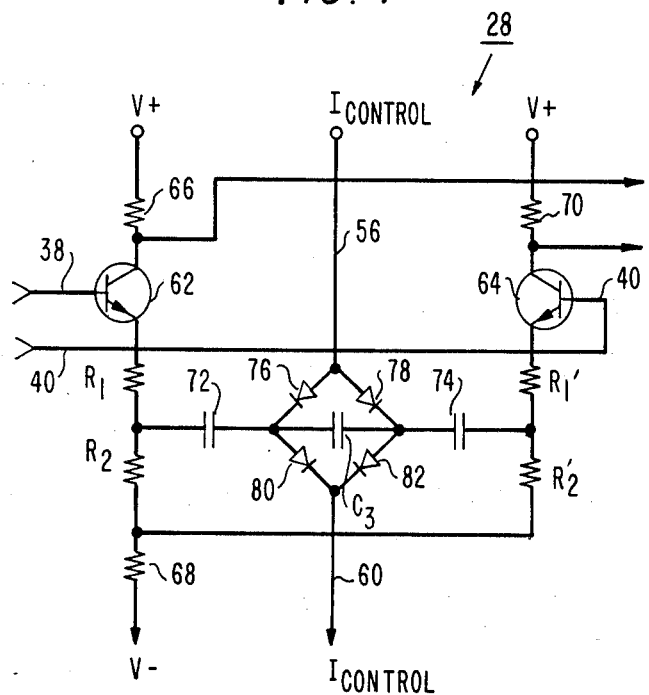
FIG. 4 is a schematic circuit diagram of a differential equalizer amplifier with a diode bridge variable resistor whose resistance (and therefore the frequency response of the whole equalizer amplifier) is controlled by $I_{control}$, which is in turn derived from the average level of the input photocurrent.

The equalizer 28 is shown in more detail in FIG. 4. It includes first and second bipolar differential input transistors 62, 64, respectively. The collector of the transistor 62 is connected to a positive supply voltage V+ through a load resistor 66. The emitter of the transistor 62 is connected through resistors $R_1$, $R_2$, and a current limiting resistor 68, respectively, to a negative supply voltage V−. The collector of the other differential input transistor 64 is likewise connected to a positive supply voltage V+ through a load resistor 70 of the same value as the resistor 66. The emitter of the other differential input transistor 64 is connected through resistors $R_1'$ and $R_2'$ and the current limiting resistor 68, respectively, to V−.

A dynamic impedance capacitor $C_3$ has one side coupled through a nominal value coupling capacitor 72 to the common node of the resistors $R_1$ and $R_2$ and the other side coupled through another nominal value coupling capacitor 74 to the common node of the resistors $R_1'$ and $R_2'$. A pair of Schottky diodes 76, 78 are connected back-to-back across the dynamic impedance capacitor $C_3$ and have their common node connected to the node 56 from the current gate 54. Another pair of Schottky diodes 80, 82 are similarly connected back-to-back across the dynamic impedance capacitor $C_3$ and have their common node connected to the node 60 of the current mirror 58. The equalizer circuit 28 has considerable symmetry in that the following groups of devices have substantially similar electrical characteristics and structures: resistors 66, 70; transistors 62 and 64; resistors $R_1$ and $R_1'$; resistors $R_2$ and $R_2'$; capacitors 72 and 74; and the four diodes 76, 78, 80, and 82.

In the operation of the circuit 34, the photodiode 14 generates an electrical current signal in response to an incident light signal. The photocurrent flows into the transimpedance amplifier 16 and generates an output signal voltage at its output node 20, which is sensed by the peak-to-peak detector 18. If the peak-to-peak amplitude is at least a preset threshold value, then the shunt resistance $R_s$ is activated to divert a.c. signal current away from the transimpedance amplifier 16 to ground through the capacitor $C_1$. In this manner, the signal voltage amplitude at the node 20 is allowed to increase until a set peak-to-peak amplitude is reached, at which point the output signal of the amplifier 16 is held constant within the AGC region.

The output signal of the amplifier 16 is fed into the first stage of the linear channel 22, namely the dual output AGC amplifier 24. >From there it is fed into the active variable equalizer amplifier 26 to undergo amplification as well as frequency shaping. The signal then proceeds to the output buffer 42 and, finally, to the passive filter 44 for noise bandwidth limiting and minimization of intersymbol interference. The signal resulting at the output nodes 46, 48 of the filter 44 is applied to detection circuitry further on in the system and not shown. In order to guarantee that the output of the linear channel 22 is constant for all values of optical input level, the output voltage of the linear channel 22 is tied into a second AGC loop. The peak-to-peak detector 50 of this second loop senses the output signal level and controls the AGC amplifier 24 so that the voltage level at the outputs 46, 48 is fixed in the presence of optical signal.

The automatic operation of the equalizer 28 is dependent on the sensing of the average magnitude of the input photocurrent and the using of the average value to control the equalizer 28 in the linear channel 22. The capacitor $C_2$ filters the photocurrent of the diode 14, which is drawn from the current mirror 38. The current mirror 38 amplifies this current and applies it to the second current mirror 58, where it is amplified again and applied to the dynamic impedance diode bridge formed by the four diodes (FIG. 4) 76, 78, 80, 82 in the equalizer 28. The values of the resistors $R_1$ and $R_1'$ and $R_2$, $R_2'$ and capacitor $C_3$ in the equalizer are chosen to appropriately set the frequency response break points when no $I_{control}$ is flowing (i.e. when the dynamic impedance of diodes 76, 78, 80, 82 is virtually infinite) such that the response contains a zero equal to the pole of the front end 12. Numerically, this zero is equal to the product of $C_3$ and $(R_2+R_2')$. Secondly, the values of $R_1$ and $R_1'$ are chosen such that there is a subsidiary pole formed in the equalizer 28 which serves to limit the overall high frequency response of the amplifier to some maximum value. This subsidiary pole is numerically determined by the product of $C_3$ with the parallel combination of $(R_1+R_1')$ and $(R_2+R_2')$.

When $I_{control}$ flows, diodes 76, 78, 80 and 82 form a dynamic shunt resistance across $R_2$ and $R_2'$ in accordance with the well known diode dynamic impedance vs. current law. It is this variable impedance which is used to control the equalizer zero.

An important ancillary function for the equalizer 28 is provided by the trigger 52 (FIG. 3). The trigger 52 controls the current gate 54 and will not allow current to flow in the diodes 76, 78, 80, 82, no matter what compliance current is supplied by the current mirror 58, unless its own input from the gate of the shunt device 19 has moved from its dormant state by an amount sufficient to indicate that the AGC function of the amplifier 16 is truly in an active state. This prevents the frequency response correction of the equalizer 28 from being applied before the AGC function of the amplifier 16 is active, since it is not needed in the absence of that condition.

The ratio adjustment of the current mirror 58 adjusts the ratio between the current applied to the diodes 76, 78, 80, 82 and the current generated by the photodiode 14. This adjustment is used during initial current circuit setup to allow for variations in diode parameters and other nominal circuit variations.

The offset adjustment of the current mirror 58 is provided to null out the effect of photocurrent-induced equalizer shift when the equalizer 28 is first triggered. This has the effect of fitting the control curve of the equalizer 28 more closely to the shunt device 19 vs. input photodiode 14 current curve and improves automatic equalizer control tracking.

While in the circuit 34 above the signal current was generated by a photodiode, it will be apparent to those skilled in the art of receivers that beneficial results may also be obtained for signal currents generated by other means. The transimpedance amplifier is protected from excessive input current and consequent saturation regardless of the nature in which the signal current is generated.

Other equalizer configurations may be substituted for the equalizer of FIG. 4. However, the equalizer 28 is particularly suited for the circuit 34 by virtue of its differential design and symmetry.

What is claimed is:

1. A signal receivieng apparatus of the type having:
    an input section including:
        a transimpedance amplifier with first and second input nodes and an output node;
        a signal current source connected between the input nodes;
        a variable shunt impedance connected between the input nodes;
        means for controlling the resistance value of the shunt impedance in response to the output of the apparatus, and
    a shaping section including an equalizer having a frequency response characteristic which compensates for the frequency response characteristic of the input section when no significant current is flowing in the variable shunt impedance, WHEREIN THE IMPROVEMENT COMPRISES:
        means responsive to input signal current for controlling the frequency response characteristic of the equalizer when significant current is flowing in the shunt impedance to maintain the frequency response characteristic of the shaping section so that it continues to compensate for the frequency response characteristic of the input section even when the latter is changed as a result of changes in the value of the shunt impedance.

2. The apparatus defined in claim 1 wherein said means responsive to signal input current comprises a first current mirror which generates a first control current proportional to the input signal current and a second current mirror connected to receive the first control current and to generate a second control current proportional to the first control current, the second control current being supplied to the equalizer.

3. The apparatus defined in claim 2 wherein said second current mirror comprises means for adjusting the proportionality of the first and second control currents.

4. The apparatus defined in claim 3 comprising trigger means responsive to the value of the shunt impedance for activating the equalizer when significant current flows in the shunt impedance.

5. The apparatus defined in claim 4 wherein the shunt impedance is a transistor having a control electrode and the trigger means are connected to the control electrode.

6. The apparatus defined in claim 5 wherein the trigger means comprise a current gate connected to a bias voltage.

7. The apparatus defined in claim 6 wherein the equalizer comprises:
    a load resistor, a transistor, a first setting resistor, and a second setting resistor, all connected in series, respectively, between a positive supply voltage and one side of a current limiting resistor to form one differential input branch;
    a second load resistor, a second transistor, a fourth setting resistor, and a fifth setting resistor, all connected in series, respectively, betweeen the positive supply voltage and the one side of the current limiting resistor to form a second differential input branch;
    first, second, and third capacitors connected in series, respectively, between the common nodes of the first and second setting resistors and the fourth and fifth setting resistors;
    first and second diodes connected back-to-back between the common nodes of the first and second capacitors and the second and third capacitors; and third and fourth diodes connected back-to-back between the common nodes of the first and second capacitors and the second and third capacitors, the other side of the current limiting resistor being connected to a negative supply voltage, the common node of the first and second diodes being connected to the output of the trigger means, The common node of the third and fourth diodes being connected to the second control current, the control electrodes of the first and second transistors being connected to the outputs of an amplifier in the shaping section, and the common nodes of the first load resistor and the first transistor and the common node of the second load resistor and the second transistor being connected, respectively, to the input nodes of a buffer amplifier.

8. The apparatus defined in claim 6 wherein said second current mirror comprises means for adjusting the offset of the respective frequency responses of the input section and shaping section when the equalizer is activated.

* * * * *